US009456500B2

(12) United States Patent
Gottwald et al.

(10) Patent No.: US 9,456,500 B2
(45) Date of Patent: Sep. 27, 2016

(54) CONDUCTOR STRUCTURE ELEMENT AND METHOD FOR PRODUCING A CONDUCTOR STRUCTURE ELEMENT

(75) Inventors: Thomas Gottwald, Dunningen-Seedorf (DE); Alexander Neumann, Rottweil (DE)

(73) Assignee: SCHWEIZER ELECTRONIC AG, Schramberg (DE)

( * ) Notice: Subject to any disclaimer, the term of this patent is extended or adjusted under 35 U.S.C. 154(b) by 1110 days.

(21) Appl. No.: 13/515,012

(22) PCT Filed: Dec. 17, 2010

(86) PCT No.: PCT/EP2010/007736
§ 371 (c)(1),
(2), (4) Date: Aug. 7, 2012

(87) PCT Pub. No.: WO2011/079918
PCT Pub. Date: Jul. 7, 2011

(65) Prior Publication Data
US 2012/0320549 A1    Dec. 20, 2012

(30) Foreign Application Priority Data
Dec. 18, 2009 (DE) .......................... 10 2009 060 480

(51) Int. Cl.
*H05K 3/30* (2006.01)
*H05K 1/18* (2006.01)
(Continued)

(52) U.S. Cl.
CPC ............ *H05K 1/186* (2013.01); *H01L 21/486* (2013.01); *H01L 21/4846* (2013.01); *H01L 21/568* (2013.01); *H01L 21/6835* (2013.01); *H01L 23/3107* (2013.01); *H01L 24/19* (2013.01); *H01L 24/20* (2013.01); *H01L 23/5389* (2013.01); *H01L 24/11* (2013.01); *H01L 24/13* (2013.01); *H01L 2221/6835* (2013.01);
(Continued)

(58) Field of Classification Search
CPC ............ H01L 21/4846; H01L 21/486; H01L 21/568; H01L 21/6835; H01L 23/3107; H01L 23/49816; H01L 24/19; H01L 24/20; H05K 1/186; Y10T 29/4913; Y10T 29/49146; Y10T 29/49155
USPC .................. 29/832, 834, 841, 846; 174/260; 257/778, 787; 438/106, 110, 113, 126
See application file for complete search history.

(56) References Cited

U.S. PATENT DOCUMENTS 2,692,190 A    10/1954 Pritikin
4,354,895 A    10/1982 Ellis
(Continued)

FOREIGN PATENT DOCUMENTS

DE    2 242 132 B2    8/1975
DE    10 2005 032489 B3    11/2006
(Continued)

*Primary Examiner* — Donghai D Nguyen
(74) *Attorney, Agent, or Firm* — Shlesinger, Arkwright & Garvey LLP

(57) ABSTRACT

The present invention relates to a method for producing a conductor structural element, comprising providing a rigid substrate, electrodepositing a copper coating on the rigid substrate, applying a conductor pattern structure to the copper coating, then possibly mounting components, laminating the substrate with at least one electrically insulating layer, detaching the rigid substrate, at least partially removing the remaining copper coating of the rigid substrate in such a way that the conductor pattern structure is exposed.

20 Claims, 24 Drawing Sheets

(51) Int. Cl.
  *H01L 21/48*   (2006.01)
  *H01L 21/56*   (2006.01)
  *H01L 21/683*  (2006.01)
  *H01L 23/31*   (2006.01)
  *H01L 23/538*      (2006.01)
  *H01L 23/00*       (2006.01)
  *H05K 3/20*        (2006.01)
  *H05K 3/42*        (2006.01)
  *H05K 3/46*        (2006.01)

(52) U.S. Cl.
  CPC .......... *H01L2221/68304* (2013.01); *H01L 2221/68327* (2013.01); *H01L 2221/68363* (2013.01); *H01L 2221/68381* (2013.01); *H01L 2224/1134* (2013.01); *H01L 2224/12105* (2013.01); *H01L 2224/13144* (2013.01); *H01L 2224/16225* (2013.01); *H01L 2224/2101* (2013.01); *H01L 2224/211* (2013.01); *H01L 2224/214* (2013.01); *H01L 2224/221* (2013.01); *H01L 2224/2201* (2013.01); *H01L 2224/224* (2013.01); *H01L 2224/32225* (2013.01); *H01L 2224/73204* (2013.01); *H01L 2224/9202* (2013.01); *H01L 2924/00011* (2013.01); *H01L 2924/0102* (2013.01); *H01L 2924/0103* (2013.01); *H01L 2924/01004* (2013.01); *H01L 2924/014* (2013.01); *H01L 2924/01005* (2013.01); *H01L 2924/01006* (2013.01); *H01L 2924/01013* (2013.01); *H01L 2924/01024* (2013.01); *H01L 2924/01029* (2013.01); *H01L 2924/01033* (2013.01); *H01L 2924/01044* (2013.01); *H01L 2924/01047* (2013.01); *H01L 2924/01061* (2013.01); *H01L 2924/01068* (2013.01); *H01L 2924/01078* (2013.01); *H01L 2924/01079* (2013.01); *H01L 2924/01082* (2013.01); *H01L 2924/01087* (2013.01); *H01L 2924/10253* (2013.01); *H01L 2924/12042* (2013.01); *H05K 1/189* (2013.01); *H05K 3/205* (2013.01); *H05K 3/429* (2013.01); *H05K 3/462* (2013.01); *H05K 3/4602* (2013.01); *H05K 2201/0355* (2013.01); *H05K 2201/0367* (2013.01); *H05K 2203/063* (2013.01); *H05K 2203/1469* (2013.01)

(56) References Cited

U.S. PATENT DOCUMENTS

| 7,268,012 B2 * | 9/2007 | Jiang .......... H01L 23/49816 |
| | | 257/778 |
| 8,347,493 B2 * | 1/2013 | Taniguchi .......... H01L 23/3107 |
| | | 29/832 |
| 2002/0039808 A1 | 4/2002 | Fukutomi |
| 2009/0242255 A1 | 10/2009 | Taniguchi et al. |

FOREIGN PATENT DOCUMENTS

| GB | 1 005 943 A | 9/1965 |
| JP | S62-158336 | 7/1987 |
| JP | H06-350234 | 12/1994 |
| JP | H07-202424 | 8/1995 |
| JP | 2001-085286 | 3/2001 |
| JP | 2001-177004 | 6/2001 |
| JP | 2001-203482 | 7/2001 |
| JP | 2001-274324 | 10/2001 |
| JP | 2003-289128 | 10/2003 |
| JP | 2003-298213 | 10/2003 |
| JP | 2005-86071 | 3/2005 |
| JP | 2007 276319 A | 10/2007 |
| WO | WO 2009/118925 | 10/2009 |

* cited by examiner

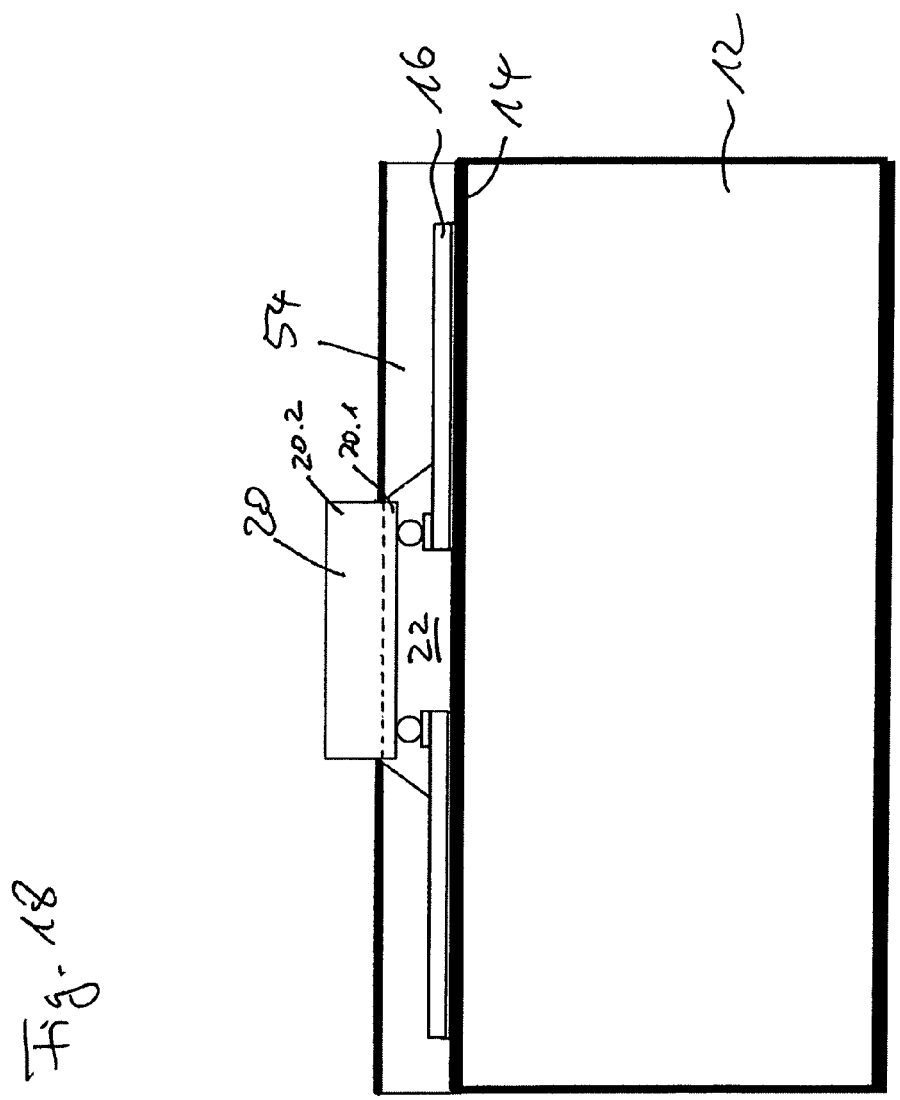

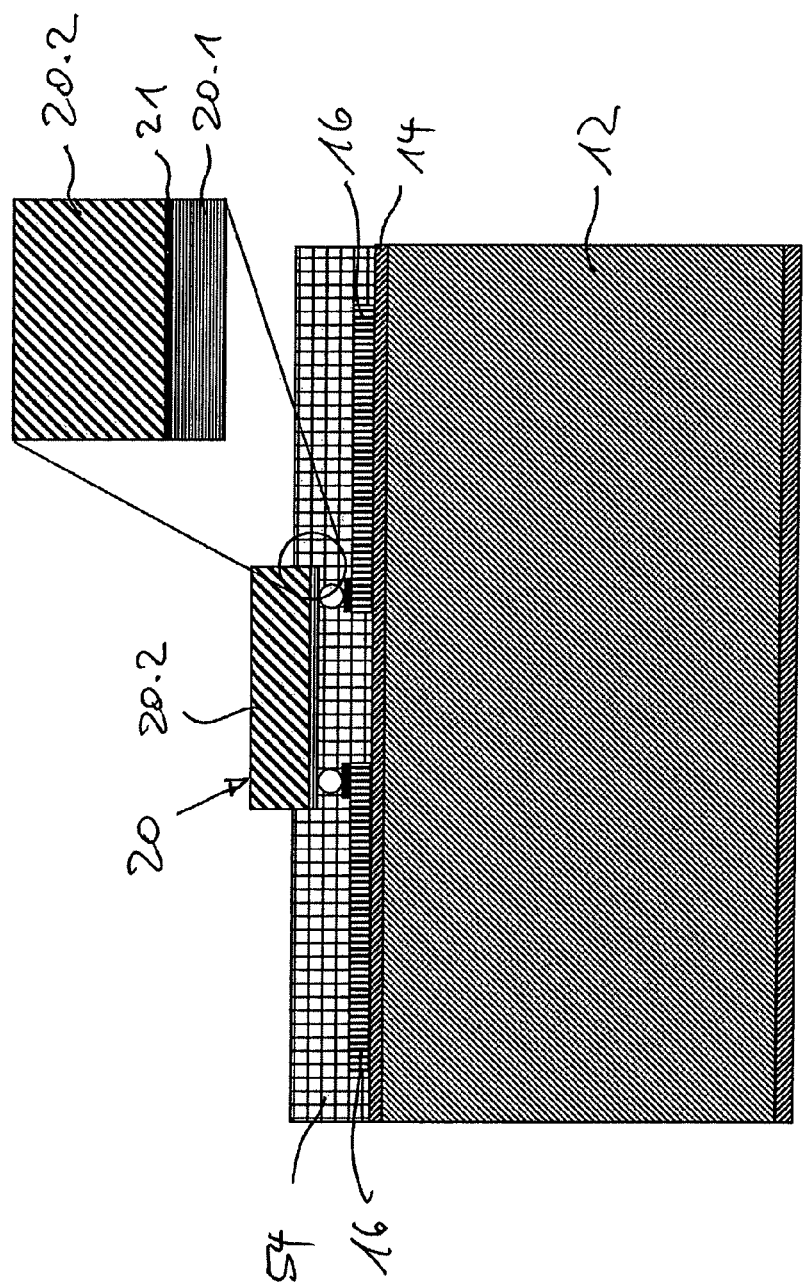

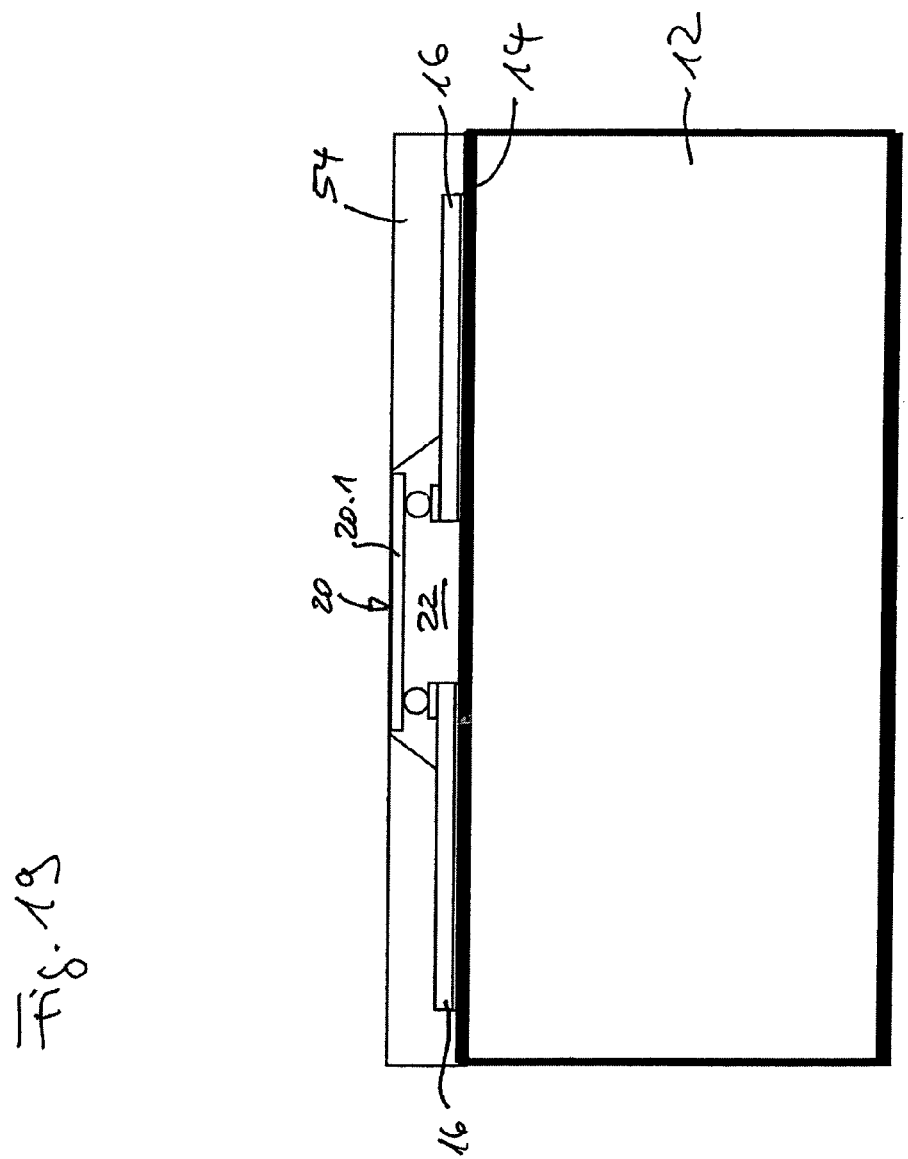

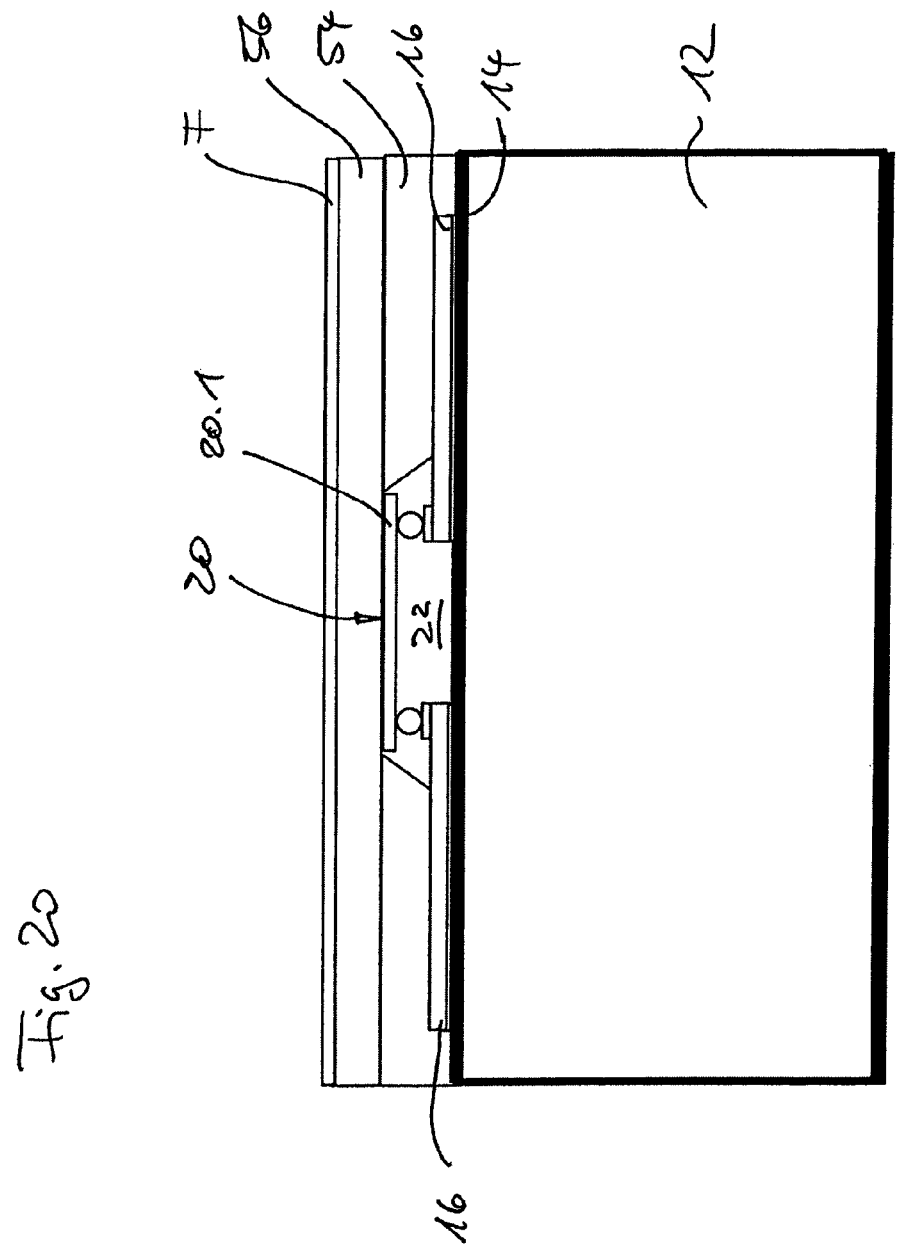

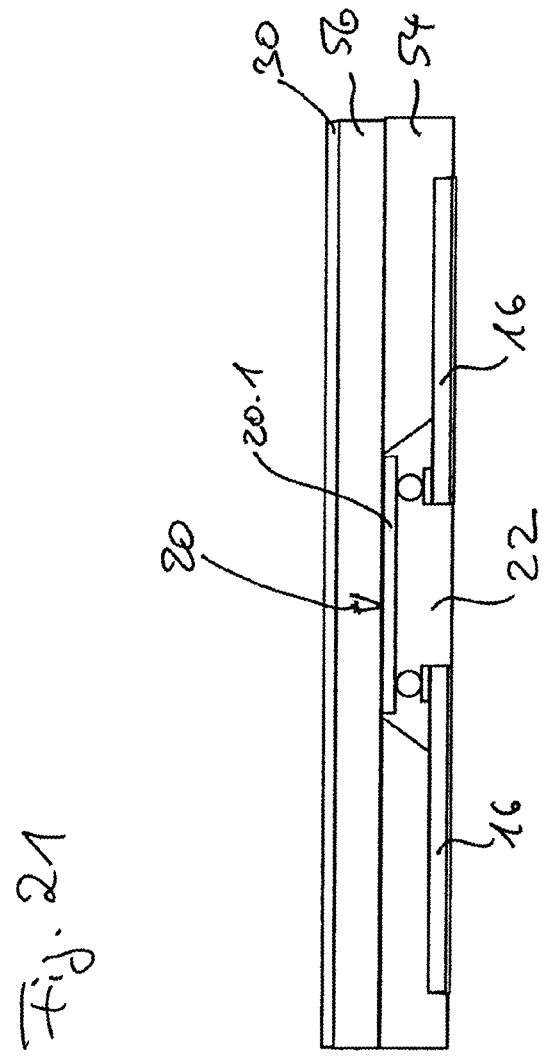

CONDUCTOR STRUCTURE ELEMENT AND METHOD FOR PRODUCING A CONDUCTOR STRUCTURE ELEMENT

The present invention relates to a conductor structure element as well as to a method for producing a conductor structure element.

From DE 2 242 132 B2 a method is known for producing a through-plated printed circuit board in which a thin copper layer having a thickness of less than 17 µm is electrodeposited on a temporary carrier of aluminium of thickness of less than 200 µm. Subsequently, a final insulation board of glass fiber-reinforced epoxy resin is applied on the copper layer and the multilayer structure is laminated or compressed, whereupon the temporary carrier or auxiliary carrier of aluminium is removed, for example, by peeling or by etching. Subsequently, an etch resist is applied to the product obtained in this manner, which etch resist corresponds to a desired circuit diagram, and the uncovered portions of the thin copper layer are removed by etching. After the etch resist has been dissolved, the final printed circuit is obtained.

From DE 10 2005 032489 B3 a multilayer printed circuit board structure is known, comprising a layer stack made from a number of layers that are electrically insulating and/or conductive and at least one passive or active electrical component in the interior of the layer stack, wherein an insert piece is provided in the interior of the layer stack, and extends laterally only in a partial region of the surface extent of the layer stack and has a wiring substrate layer, on which the electrical component is mounted.

Based on this, the invention proposes a method for producing a conductor element with the features of a conductor structure element as disclosed herein.

The invention is based on the fundamental concept of using in the production of as thin as possible conductor structure elements (which may also be, for example, a so-called interposer, as known from above-cited DE 10 2005 032489 B3 a rigid carrier on which a copper coating is adhesively electrodeposited, on which in turn a conductive pattern structure, followed by possible assembly with components, is applied. The intermediate product produced in this manner is insulated with at least one electrically insulating layer and subsequently the rigid carrier is detached and the electrodeposited copper coating of the carrier is removed so that an exposure (electrical separation) of the conductive pattern structure takes place.

Within the scope of the present invention the term "conductor structure element" is understood to mean any type of two-layer or multilayer structure with at least one plane of a conductive pattern structure. This includes assembled or non-assembled printed circuit boards or printed circuit board parts, multilayer structures, interposers for use as "component housings" in prefabricated multilayer printed circuit board structures, etc.

The procedure according to the invention renders possible the production of extremely thin and very fine conductive pattern structural elements and multilayer structures, since the production process, including steps such as soldering, assembling, etching, through-plating, etc., takes place on a copper layer firmly connected to the rigid carrier and thus can be carried out without great difficulty.

The detachment of the rigid carrier can be, for example, a chemical, physical or mechanical detachment or removal. For example, the rigid carrier is composed of an amphoteric material or metal which can be dissolved in a basic solution that does not attack copper. Thus, for example, aluminium or an aluminium alloy can be used as a material for the rigid carrier and the detachment can be carried out by etching off the rigid carrier in caustic soda without the electrodeposited copper coating of the carrier being attacked. Other amphoteric materials or metals can likewise be used; these are known to the person skilled in the art (such as zinc, for example). A further possibility, for example, is to use carriers that are mechanically removable, e.g. by milling.

The term "rigid carrier" gives the person skilled in the art the teaching to use a sufficiently thick carrier material in order to ensure that during the production of the conductive pattern structure and the subsequent further processing and working, including the assembly with components, no undesirable bending of the layer structure occurs. With the use of a rigid carrier of aluminium, this can be achieved, for example, by layer thicknesses of approx. 500 µm to 1,000 µm; of course, thicker layers can also be used, but this may be less expedient economically. The use of somewhat thinner layers, possibly up to approx. 350 to 400 µm thick, is also conceivable, although with layer thicknesses of this type the risk of slight bending during processing already occurs. The thickness is in each case adapted to the format size to be used. When other materials are selected, the layer thicknesses can vary accordingly.

The electrodeposited copper coating of the rigid carrier typically has a thickness of between approx. 2 and approx. 7 µm. Before the application of the electrodeposited copper coating a pretreatment of the rigid carrier, with which a person skilled in the art is familiar, may be necessary (for example, a conventional zincate treatment, if aluminium is used). Due to the copper coating of the rigid carrier, which is carried out either completely or at least on the surface area of the rigid carrier intended for the application of a conductive pattern structure, a surface that can be plated is produced, which furthermore is compatible with the process chemicals generally used.

The application of the conductive pattern structure is carried out according to conventional methods known to the person skilled in the art, such as, for example, the pattern plating method (conductor path structure). The plating may also comprise the application of so-called register marks. Alternatively to the register marks, holes can also be provided for subsequent alignment during assembly.

An etch-resistant metal layer may optionally be deposited below the plated conductive pattern layer.

The plated layer may be given a coating such as a precious metal coating on the component contacts.

Following the first plating (that is, the first conductive pattern structure), further suitable process steps (such as photo processes) may be used to plate individual regions more heavily than others in a targeted manner so that different copper layer thicknesses are generated in a layer. This procedure differs from the prior art which teaches providing a thick copper layer and thinning it partially by means of an etching process.

Before component assembly, a separation of the rigid and large-area carrier, which is present in the so-called manufacturing format, into smaller format sizes (individual card size) may take place. The so-called individual card format is a format that can be handled in standard assembly devices. This facilitates component assembly within the scope of a standard process and is rendered possible according to the invention in that the rigid carrier ensures a rigid and flat substrate and possible bending of the substrate during processing is minimized to the extent that it does not have any negative impact on the assembly result. Typical components for assembly comprise among other things (unhoused) silicon chips, passive components (C, R, L, i.e., capacitors, resistors, coils or inductance coils) as well as, for example, inlays or insert pieces (cf. DE 10 2005 032 489 B3 already cited).

Further structural and/or joining techniques that are used within the scope of the further processing or working of the printed circuit board multilayer structure are, for example, flip chip soldering, the application of Au stud bumps, ACA/ICA bonding, etc.

After assembly, a so-called underfilling process, i.e. the underfilling of at least one of the assembled components, may optionally be carried out. However, with many applications the resin of the prepreg layers still used should be sufficient in order to fill the region under the components or chips.

After assembly is completed, the individual cards can be inserted into a suitable frame (fitting frame) for parallel further processing.

The assembled multilayer structures are then provided with a prepreg layer. This can be either a full-area layer or a layer with recesses in the region of the assembled components or a combination of both. This layer structure is compressed together with a terminating layer which is formed, for example, by a copper foil, and/or with a PCB semi-finished product composed of a sequence of several conducting and insulating layers, whereby the components are laminated in. The terminating layer film can have a thickness of approx. 5 µm to approx. 105 µm, in exceptional cases it may even be thicker. Thin foils, e.g. foils 5 or 7 µm thick, are very often laid with a thicker carrier foil that can be detached. With the use of a thin copper foil of this type, the carrier foil can be easily peeled off after compression, since, due to the rigid carrier, the entire laminate is likewise rigid and has a sufficient stiffness that withstands the forces occurring during peeling.

After the lamination, a rigid substrate is obtained which can be easily further processed by means of further printed circuit board processes known per se. If necessary, for example, blind holes may be bored to an assembled chip or to the underside, using known techniques, for example, by means of a laser. If an exact positioning of the laser holes to the components is necessary, in this section of the process it is possible to fall back on the plated register marks or holes made.

After the structuring of the plated layers, the already described detachment of the rigid carrier according to the invention is finally carried out. As already described, this can be an alkaline etching process, for example, by which the copper coating is not attacked, or not substantially attacked. Pure caustic soda (NaOH) may be used for this purpose. After the detachment of the rigid carrier according to the invention, the copper coating originally electrodeposited on the rigid carrier remains behind, and compared to the plated rewiring structure this copper coating is very thin and, for example, can be differentially etched very easily even without any intervening etch resist, and as a result the embedded conductive pattern structure is exposed and thus is electrically separated from the electrodeposited copper layer.

After the described step of compression, etching (to detach the rigid carrier) and optionally differential etching can be carried out directly. To achieve elevated contact surfaces, the locations provided for this purpose can be protected during the etching process by an appropriate coating (photo resist).

The exposed conductor paths can be protected partially or completely with solder stop lacquer or compressed with a further prepreg layer, whereby the resistance of the printed circuit board multilayer structure is increased with respect to temperature cycles.

With the invention ultra-thin component packages can be achieved which can also be used, for example, as interposers for further embedding in printed circuit boards. Another application can be the production of ultra-thin flexible circuit mounts with already assembled components for placement on so-called flex substrates.

Finally, with respect to the production of ultra-thin packages the invention opens up the possibility of eroding an assembled chip mechanically and/or chemically, in that the "dead" silicon of the chip, i.e., the non-active chip layers, is removed down as far as the active chip layers.

To this end an etch-resistant layer can be applied which has a sufficient thickness to cover the active chip layers laterally. The non-active chip layers projecting upwards are then removed, for example by chemical etching. A mechanical removal of the non-active silicon layer is also possible.

Further advantages and embodiments of the invention are shown by the specification and the attached drawing.

It is understood that the features referenced above and to be explained below can be used not only in the combination respectively given, but also in other combinations or alone without departing from the scope of the present invention.

The invention is shown diagrammatically in the drawing based on an exemplary embodiment and is described in detail below with reference to the drawing.

FIG. 1, in order to illustrate the method according to the invention, shows a cross-sectional side view of a rigid carrier with copper coating.

FIGS. 18 and 18*a* show a cross-sectional side view of a conductor structure element according to the invention in which active chip layers are covered laterally with a permanent etch resist.

FIG. 19 shows the conductor structure element of FIG. 18 with a back-thinned chip, i.e. a chip with non-active layers removed.

FIG. 19*a* shows in an alternative embodiment to FIG. 19 the conductor structure element of FIG. 18*a* with a lower-lying chip after the back-thinning.

FIG. 20 shows the conductor structure element of FIG. 19 after compression.

Figure 20A:
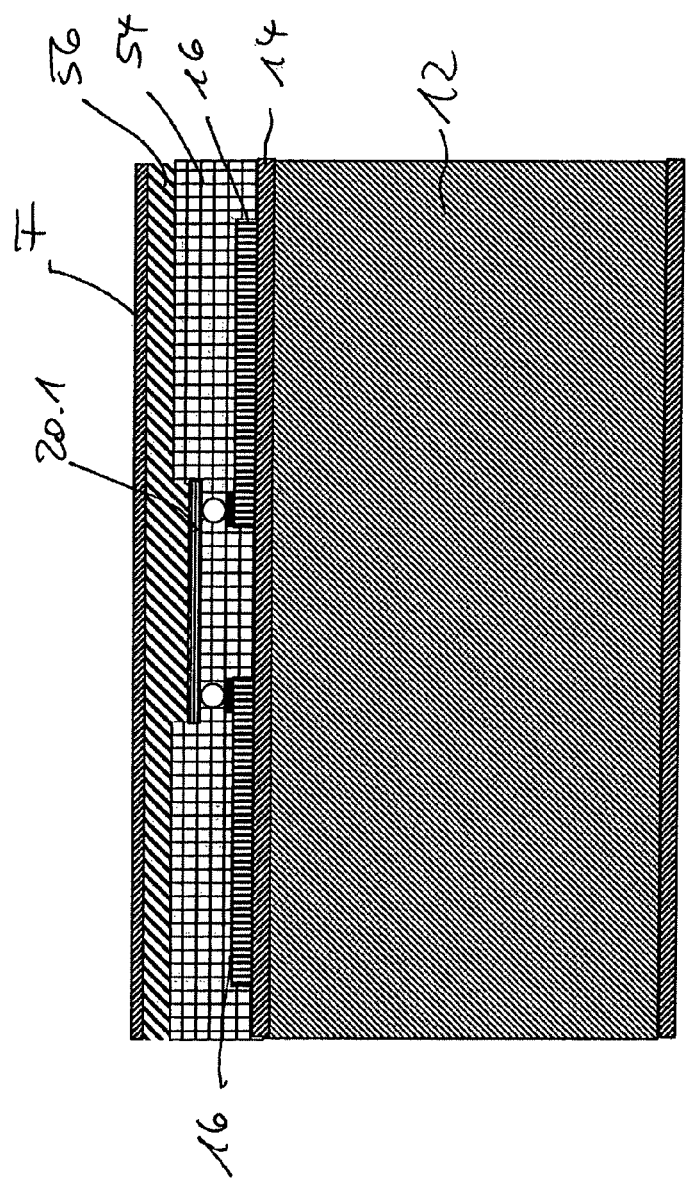

FIG. 20*a* shows the conductor structure element of FIG. 19*a* after compression.

FIG. 21 shows the conductor structure element of FIG. 20 after the detachment of the rigid carrier and differential etching.

The method according to the invention is now described with reference to the figures. It should be noted that the illustrations in the figures are highly schematic and in particular are not true to scale.

Figure 1:
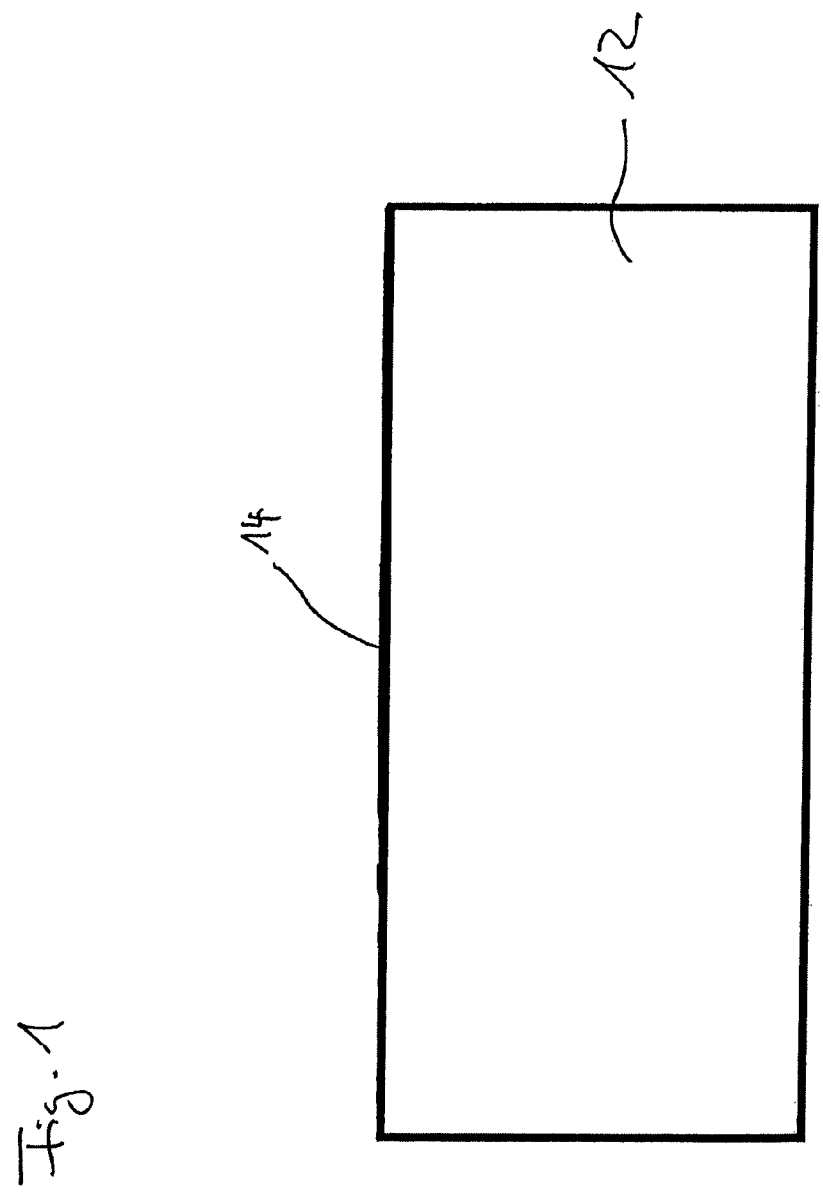
Figure 2:
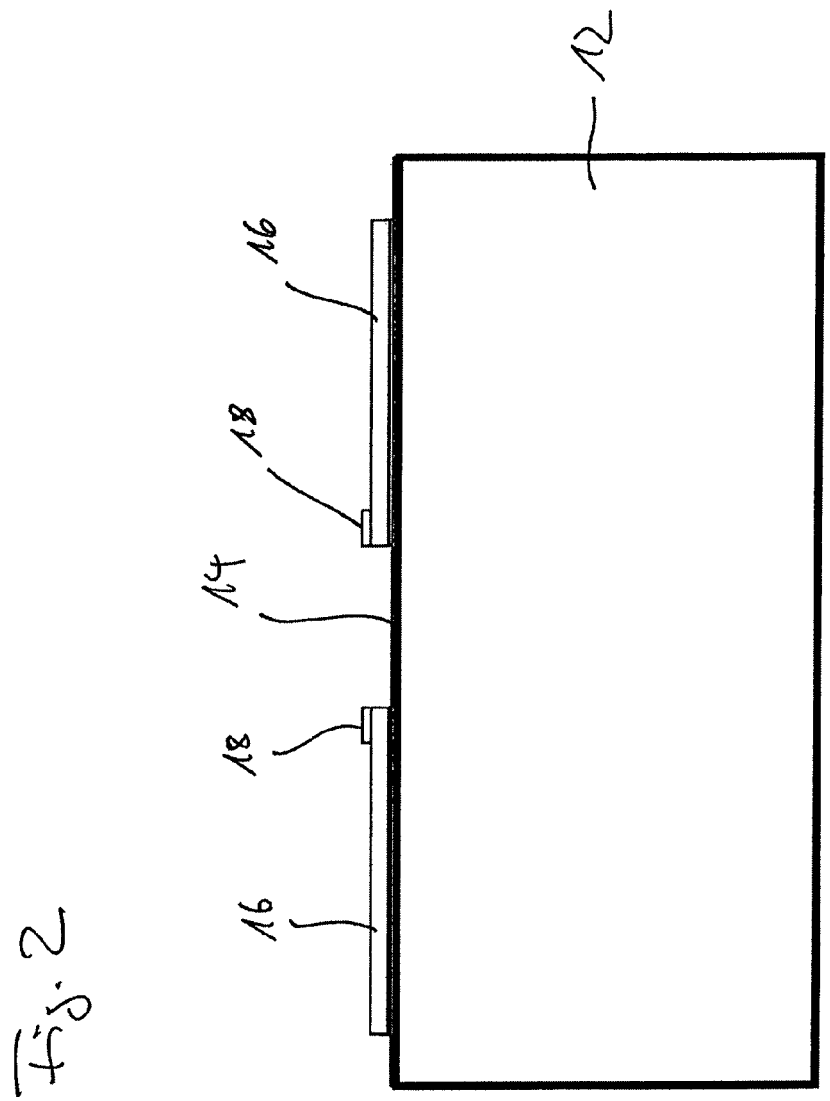
FIG. 2 shows the carrier of FIG. 1 with an applied conductive pattern structure.
Figure 3:
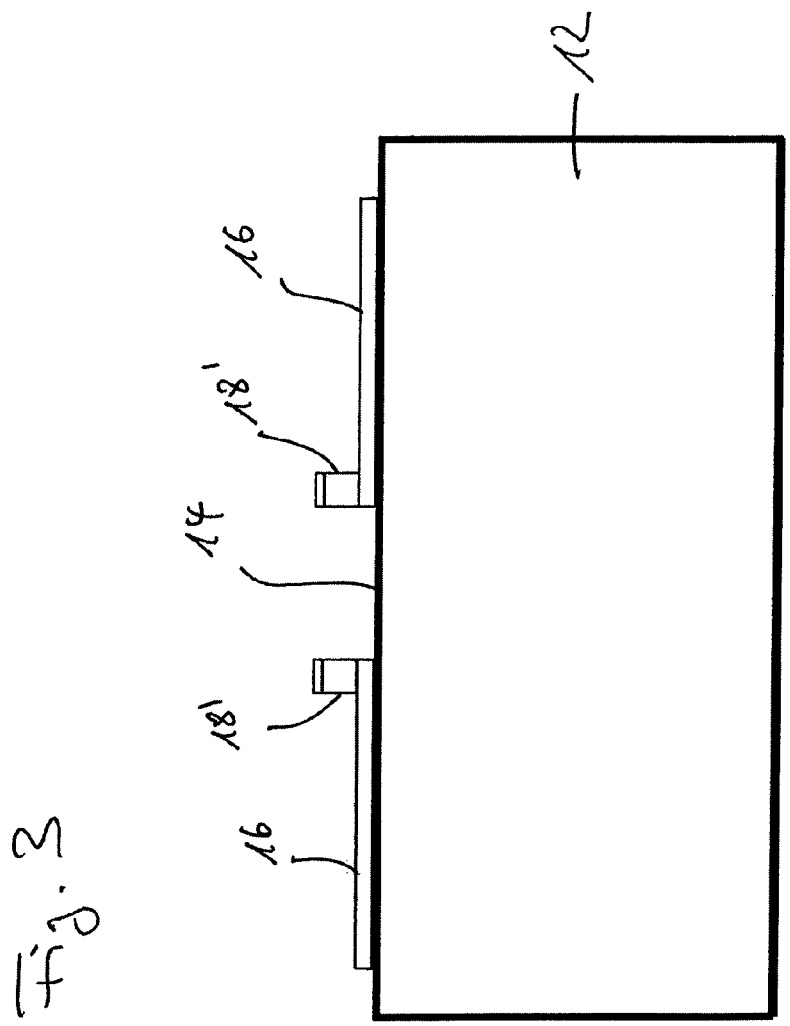
FIG. 3 shows the carrier structure of FIG. 2 with elevated contacts.
Figure 4:
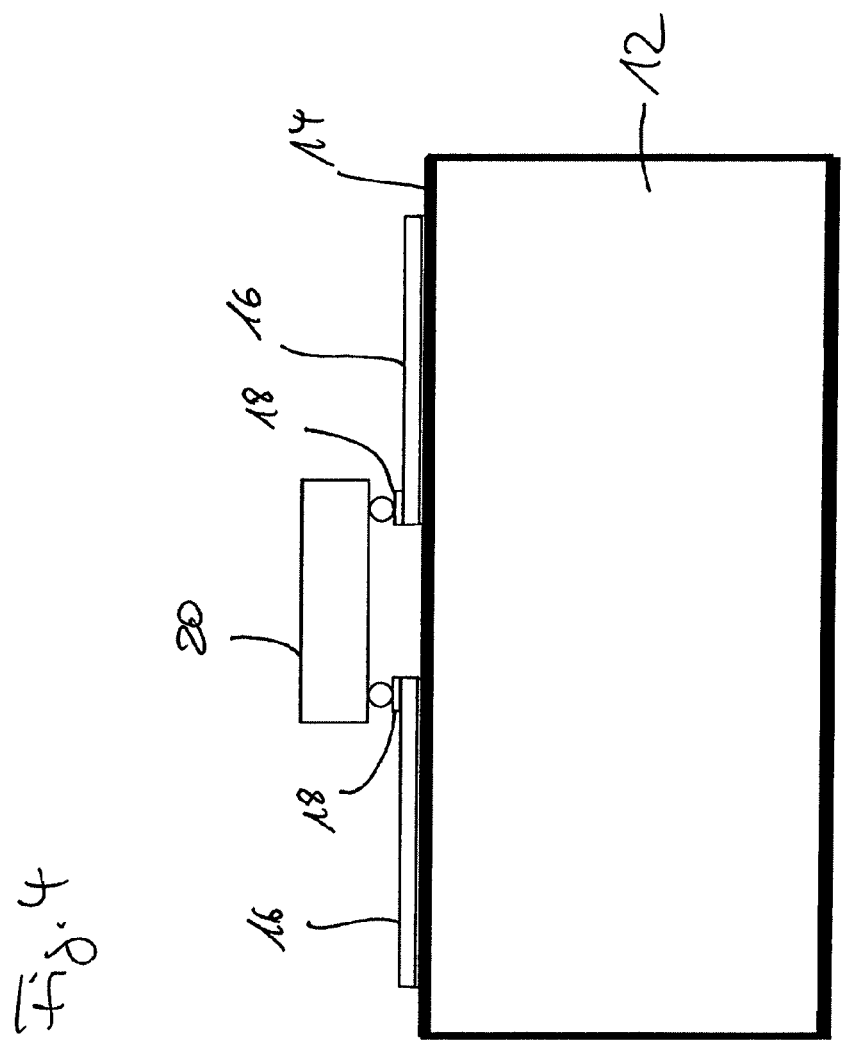
FIG. 4 shows the carrier structure of FIG. 2 after a component assembly.

FIG. 1 shows a cross-sectional side view of a rigid carrier 12 which essentially has a block-shaped form and in particular has at least one flat surface. The rigid carrier 12 is used according to the invention as the basis for applying a multilayer structure. The rigid carrier is made of a sufficiently rigid material, as already described at the beginning hereof, in order to prevent as far as possible harmful bending of the layer structure during the further processing of the thin layers to be applied to the carrier.

Furthermore, the rigid carrier according to the invention must have the material property that it can be detached without damage to the copper layers applied thereon. For example, the rigid carrier is a carrier of amphoteric metal such as aluminum, for example, or a suitable aluminum alloy.

A copper coating 14 is electrodeposited on the carrier. Where applicable, this requires a pretreatment of the rigid carrier, as in the case of aluminum, e.g. a usual zincate treatment.

In a next step, a conductive pattern process is carried out on the electrodeposited copper coating 14, i.e. a conductive pattern structure 16 is applied by photolithography, for example, in the so-called pattern plating process.

Contact surfaces 18 for components are formed on the conductive pattern structure 16, where applicable by selective plating, and they may in some cases be provided with a precious metal coating (Au, Ag, NiPdAu, etc.)

An etch-resistant barrier layer (not shown), for example of Au, Ag, Ni, etc., may be provided between the copper coating 14 and the conductive pattern structure 16.

The contact surfaces for components may alternatively be designed as columns 18' with or without component contacts. Due to the greater distance from the conductive pattern structure, the reliability of the connection between the component and the conductor structure is increased in later use, and wafer preparation is simplified. Usually the formation of column structures of this type on thin layers is extremely problematic—with the invention it is possible to provide even the thinnest layers with such contact bumps for components.

Figure 6:
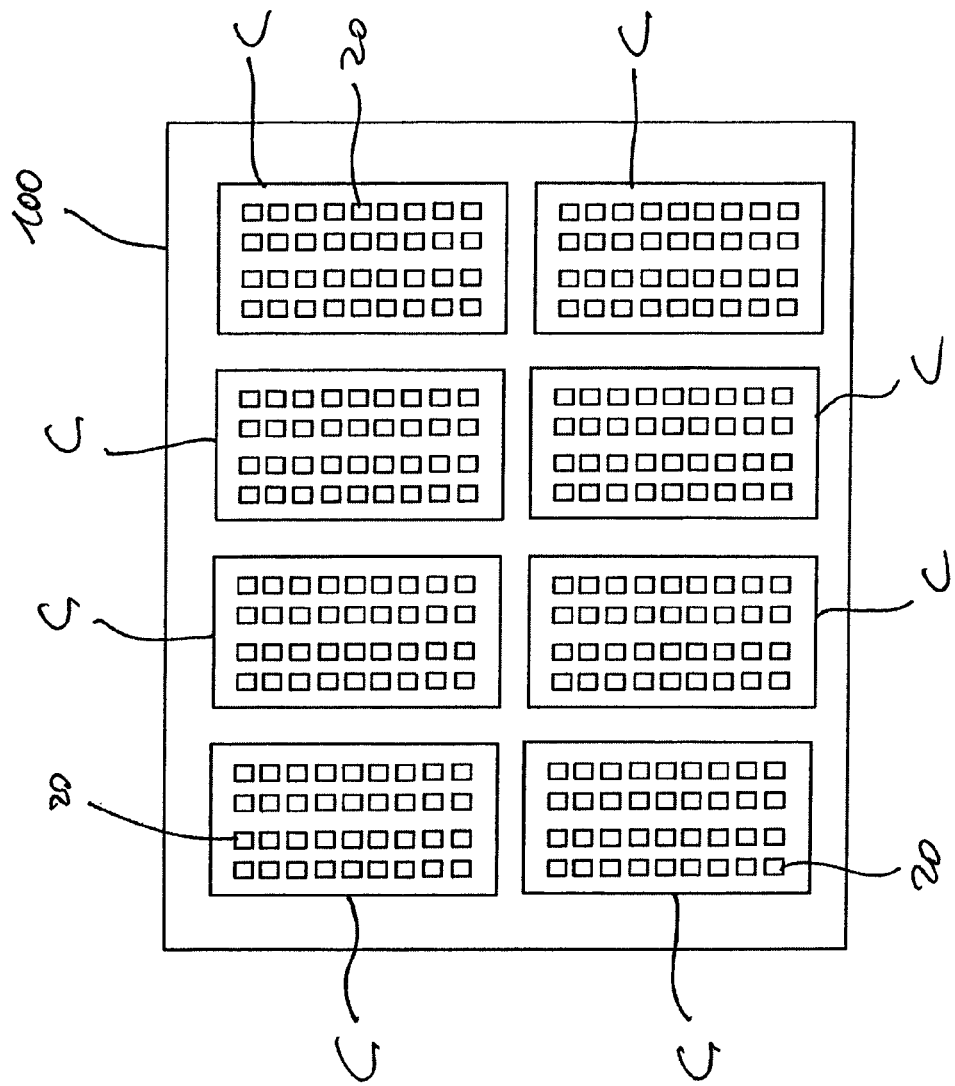
FIG. 6 shows a highly schematic top view of a fitting frame with inserted and assembled individual cards.

In a next step, populating of the conductive pattern structure with components 20, for example a chip or other conventional active and/or passive components, takes place. According to the invention, the assembly on the thin conductive pattern layer is also designed to be very simple, since, due to the rigid carrier 12, a rigid and flat surface to be populated is provided. Before the assembly operation, the rigid carrier 12, which is present in a larger format, can be "subdivided" or "individualized", i.e. divided in its format into individual card formats, e.g. into the so-called "eurocard", which then after assembly can be replaced in a fitting frame for further (parallel) processing. FIG. 6 shows by way of example in schematic top view a fitting frame 100 with inserted individual cards C assembled with components 20.

Figure 5:
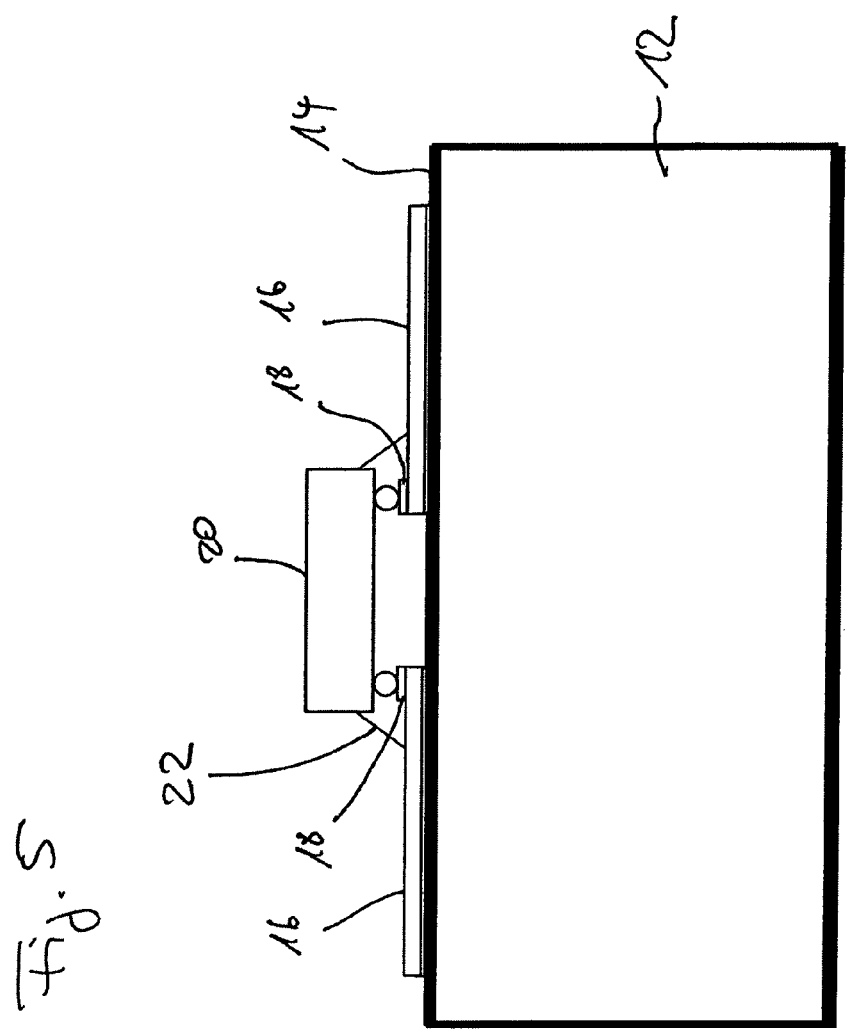
FIG. 5 shows the carrier structure of FIG. 4 with an underfilled component.
Figure 7:
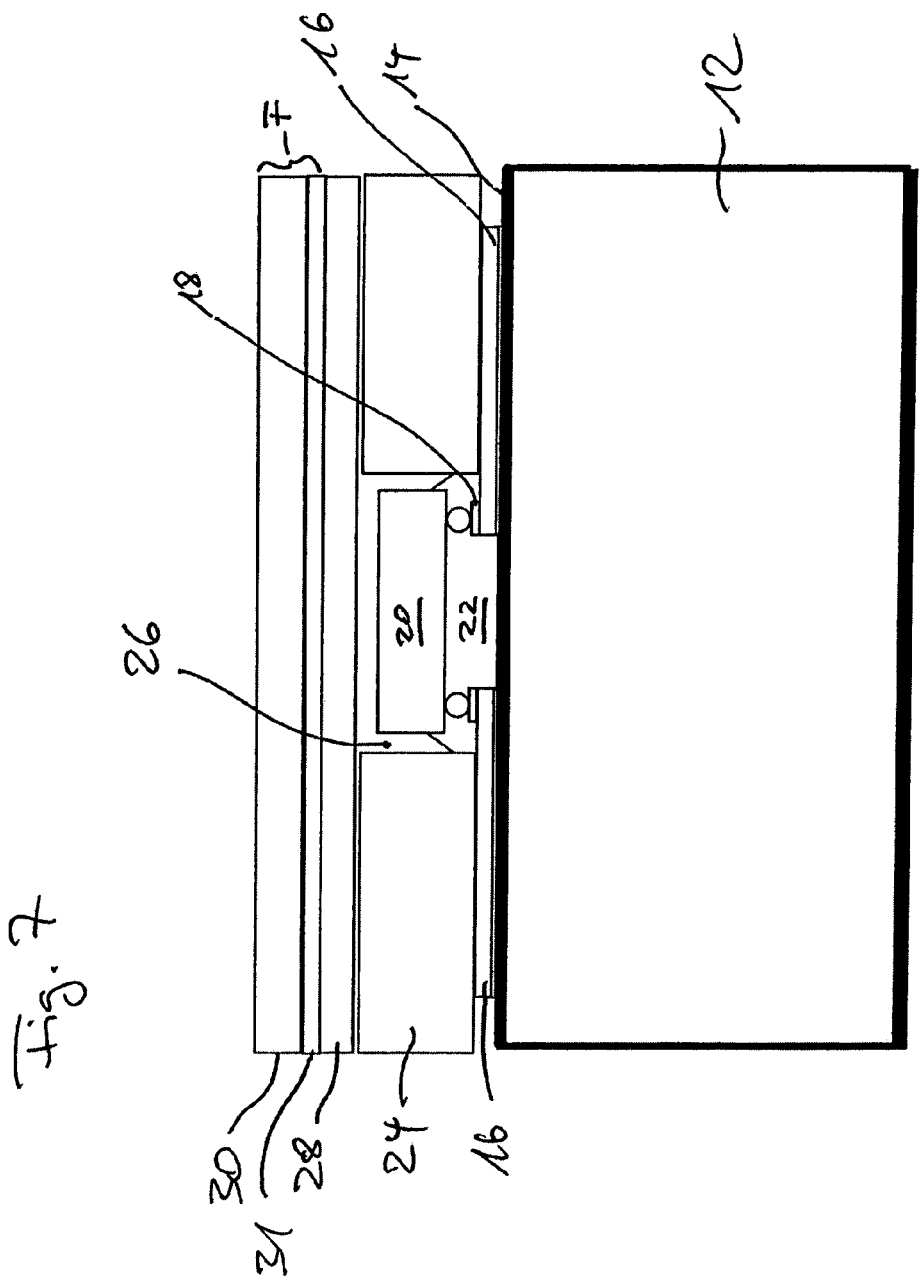
FIG. 7 shows the carrier structure of FIG. 5 before compression.

The assembled components can all or in part be underfilled with a suitable material in a manner known per se (FIG. 5, reference number 22) before (likewise in a manner known per se) compression layers, such as adhesive layers or prepreg layers or the like are applied for compression of the multilayer structure, as is shown schematically in FIG. 7.

Depending on the assembly of the conductive pattern structure 16, a full-area prepreg or—as shown in FIG. 1—a first prepreg layer 24 with a recess 26 to accommodate a component 20 and thereon a second full-area prepreg layer 28 can be applied. Due to this procedure a cavity is produced around the component 20. Alternatively, a prepreg layer can be used with a non-through recess, which already forms a cavity. Depending on the component geometry, the full-area prepreg layer 28 can also be omitted. A copper film F can be applied on the upper prepreg layer 28 or 24, before the entire structure—again in a manner known per se—is compressed. Instead of prepreg layers, resin-coated copper foil, so-called RCC foil (Resin Coated Copper) or RCF (Resin Coated Foil) can be used. In this case, the creation of cavities can be omitted, depending on the component geometry. In order to be able to omit the use of cavities or openings or recesses (26) in prepregs, it is likewise conceivable to obtain a flat substrate by applying a liquid coating of the spaces, on which substrate a structure of further prepregs can be built up.

Figure 8:
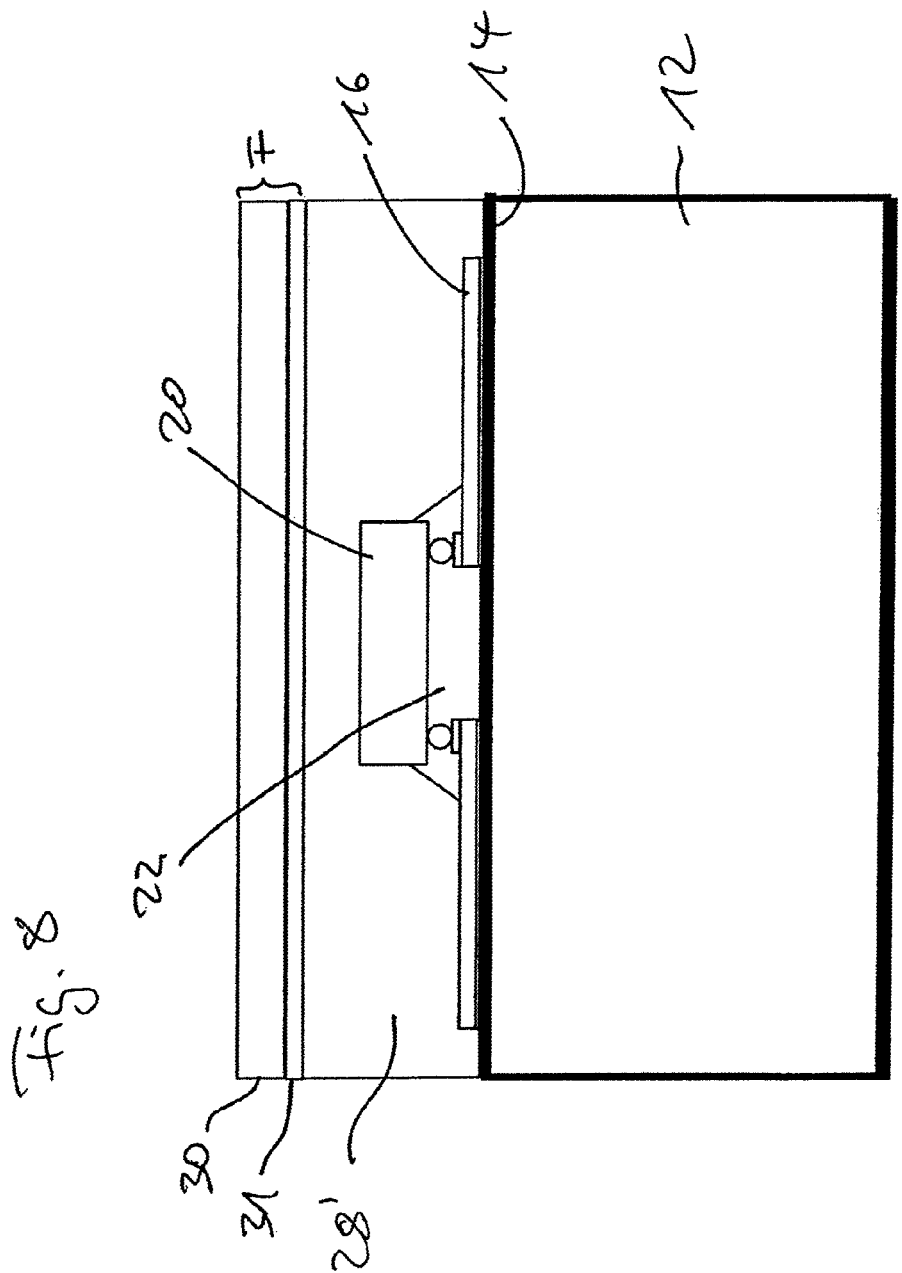
FIG. 8 shows the carrier structure of FIG. 7 after compression.

FIG. 8 shows the multilayer structure after the compression with component 20 positively (in form-fitting manner) embedded in a resin layer 28'; the resin layer 28' has been produced from the prepreg layers 24, 28 liquefying during the compression and subsequently solidifying again. In the embodiment shown, the copper foil F comprises a somewhat thicker carrier foil 30 (with a thickness in the order of magnitude of 70 μm) on which, for example, separated by a thin chromium layer, a thinner base copper foil 31 is applied (the thinner foil has a thickness in the order of magnitude of 7 μm). The copper foil F is applied with the thinner base copper foil 31 facing towards the resin layer 28'.

Figure 9:
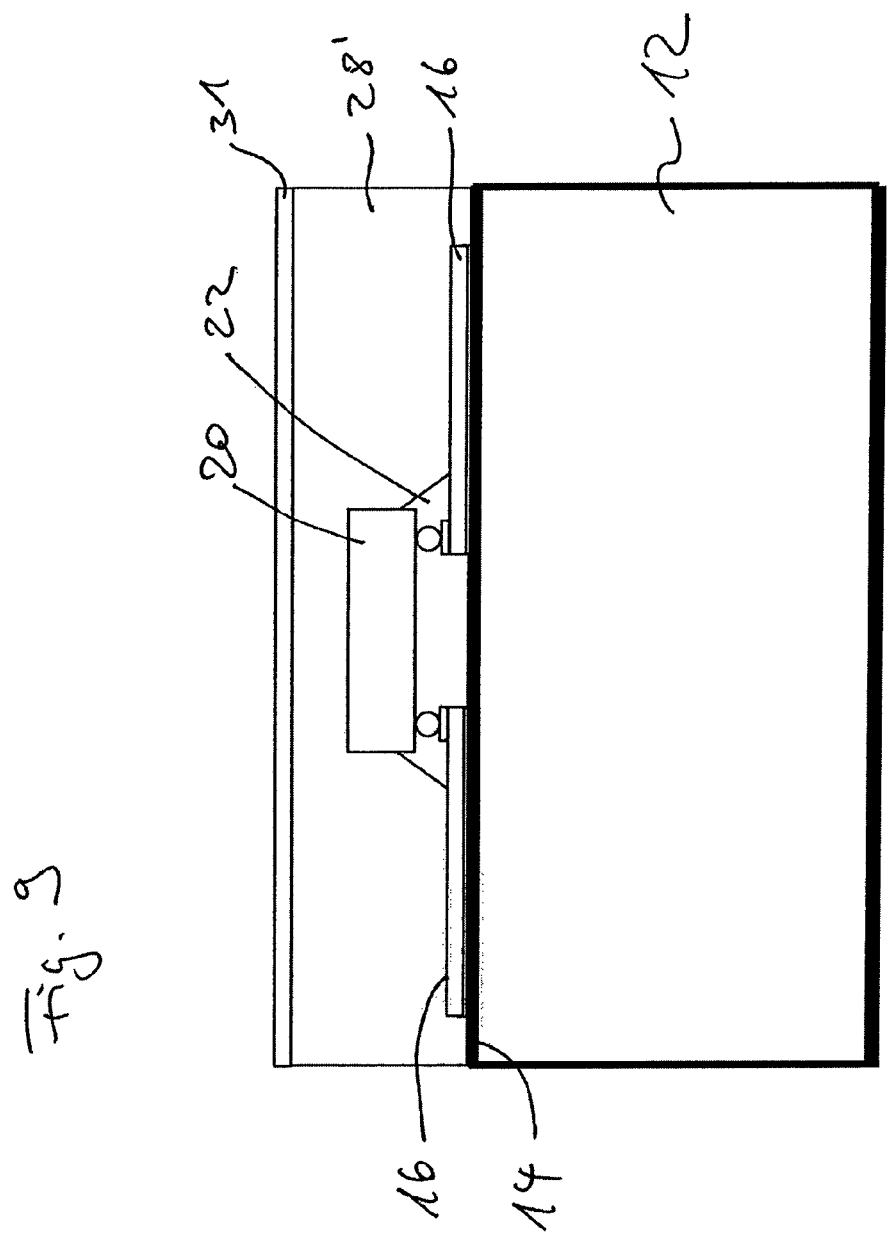
FIG. 9 shows the carrier structure of FIG. 8 after the laminated carrier film has been stripped off.

In a next step, the carrier foil 30 (if present) is peeled off (cf. FIG. 9), which likewise proves to be unproblematic due to the rigid substructure of the carrier 12—otherwise it would be hard to easily peel a carrier foil off a thin layer. After the carrier foil 30 has been peeled off, the much thinner base copper foil 31 remains on the mutlilayer structure. Before the rigid carrier 12 is detached, further processing possibilities are now opened up for the mutlilayer structure according to the invention.

Figure 10:
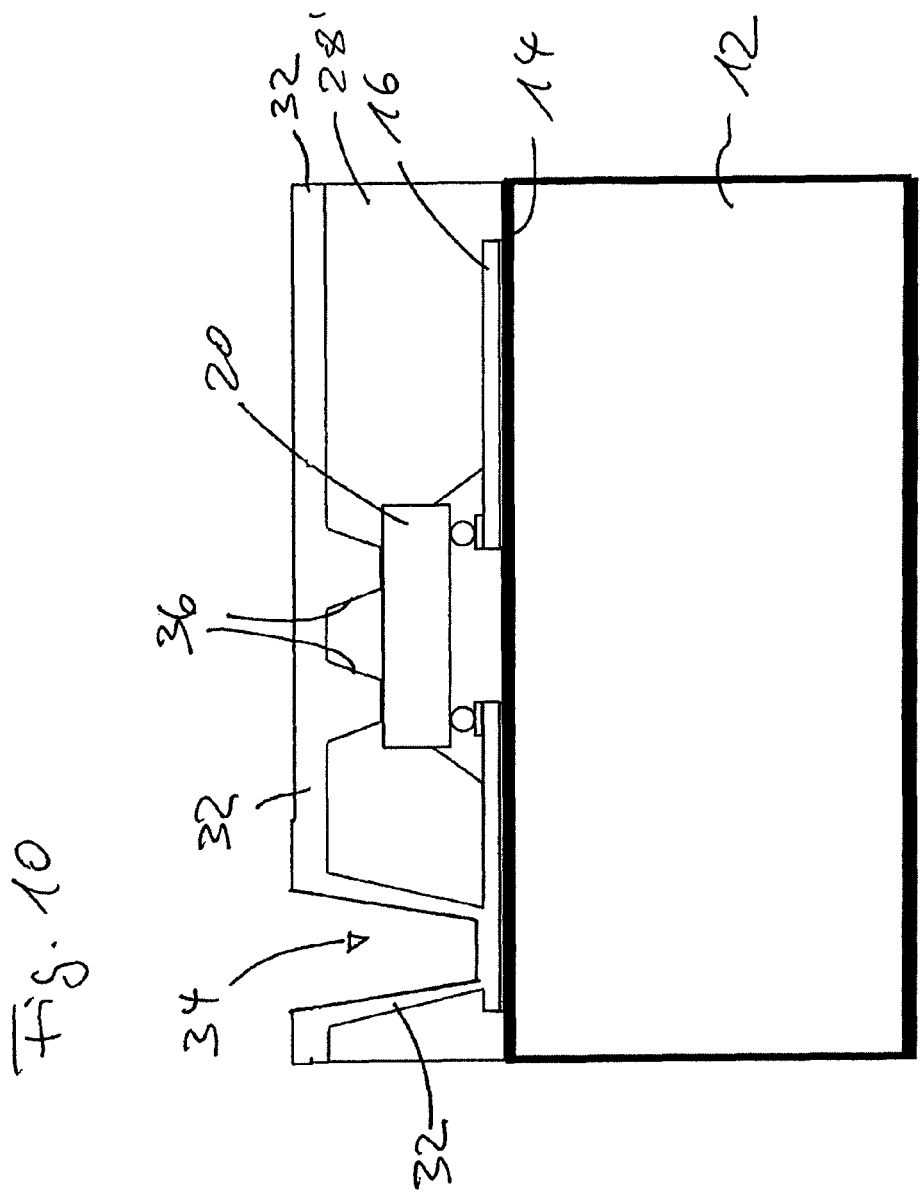
FIG. 10 shows the carrier structure of FIG. 9 with through-platings.

FIG. 10 shows, for example, the possibility of producing a blind hole 36 on the surface of the component 20 and/or a blind hole 34 on the plane of the conductive pattern structure 16 for the purpose of contacting. For this, the chip or the component 20 should have an electroplating-compatible surface. The boring can be carried out, for example, by laser drilling, with subsequent plating to produce a continuous copper layer 32 (the copper layer 32 is composed of the laminated base copper foil 31 plus copper electrodeposited thereon). In the exemplary embodiment shown, the blind holes 36 for contacting of the component 20 are completely filled with copper, while the walls of the blind hole 34 for contacting of the conductor paths are coated with copper.

Figure 11:
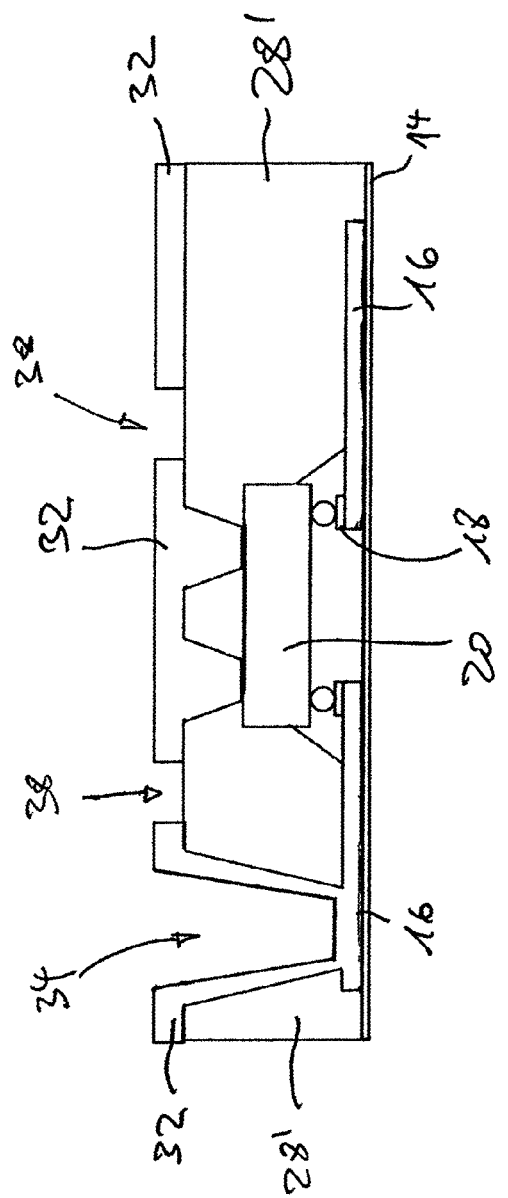
FIG. 11 shows the conductor structure element according to the invention after the removal of the rigid carrier.

In a next step (cf. FIG. 11), the rigid carrier 12 is removed. This is carried out by dissolving or etching of the rigid carrier 12 in a suitable medium; in the case of aluminum this would be caustic soda, for example. If necessary, before the detachment of the rigid carrier 12, an etching step for etching the "base copper," that is, the copper plating 14 of the carrier 12 on the underside (as shown in the figure) of the carrier is carried out, followed by selective etching of the rigid carrier 12, and finally by removal of the copper coating 14 on the underside of the multilayer structure, for example, by differential etching, thereby exposing the conductive pattern structure 16. In the course of this, individual points of the copper layer 32 (cf. reference number 38) and of the copper layer 14 (not shown) can also be selectively etched.

"Differential etching" here means an etching process in which an etching medium dissolves the copper (here: copper coating 14), but does not thereby remove or only slightly removes the underlying structure (here: conductive pattern structure 16). This requires a precise control of the etching depth and permits removal of the top layer without using etch resist. If, for example, given a layer thickness of approx. 5 µm of the (top) layer (copper coating 14) to be removed, etching is carried out by differential etching to approx. 7 µm in depth, then the top layer will be completely removed, while the underlying layer (the conductive pattern structure) will be reduced in thickness by only approx. 2 µm.

The structures ("packages") produced can still be processed even after the removal of the rigid carrier 12, for example, by generating through platings 40 by means of drilling (laser, mechanical, plasma) and subsequent plating with copper.

Figure 12:
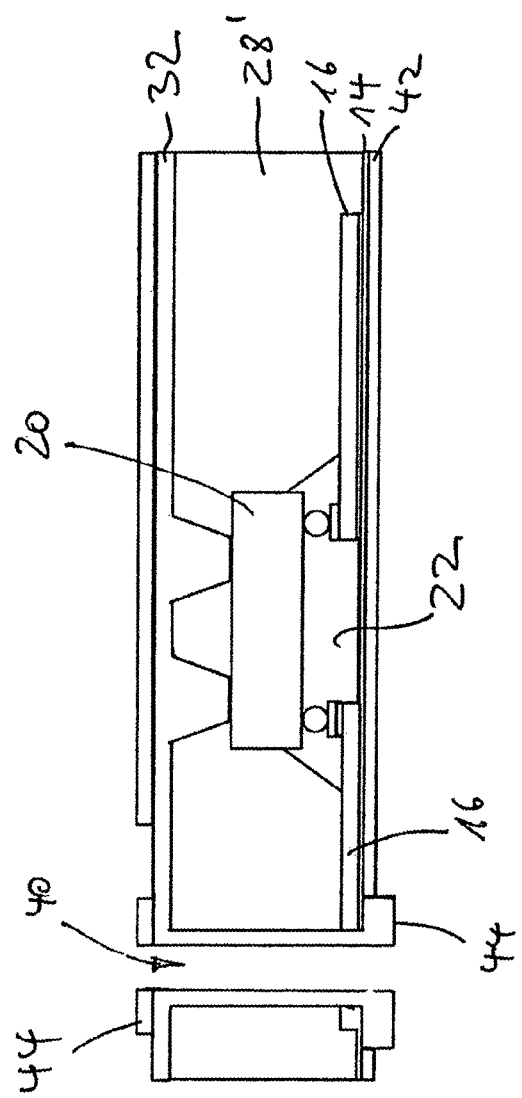
FIG. 12 shows an alternative multilayer structure to that shown in FIG. 11.
Figure 13:
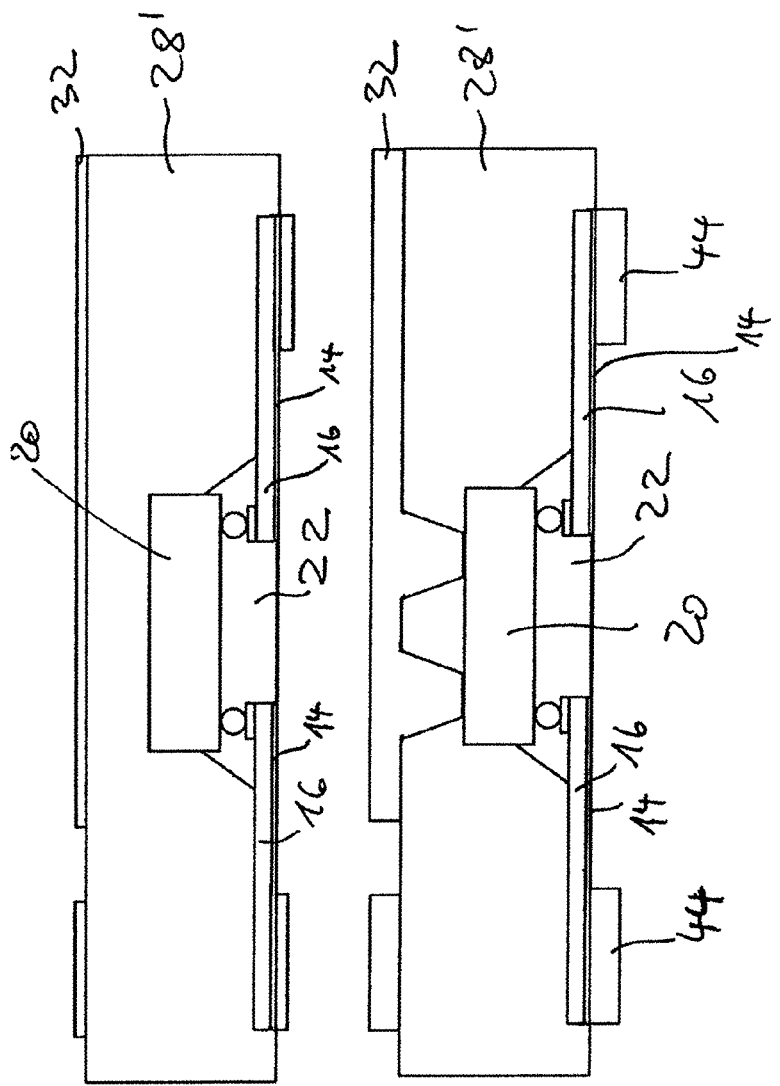
FIG. 13 shows further alternative multilayer structures.
Figure 14:
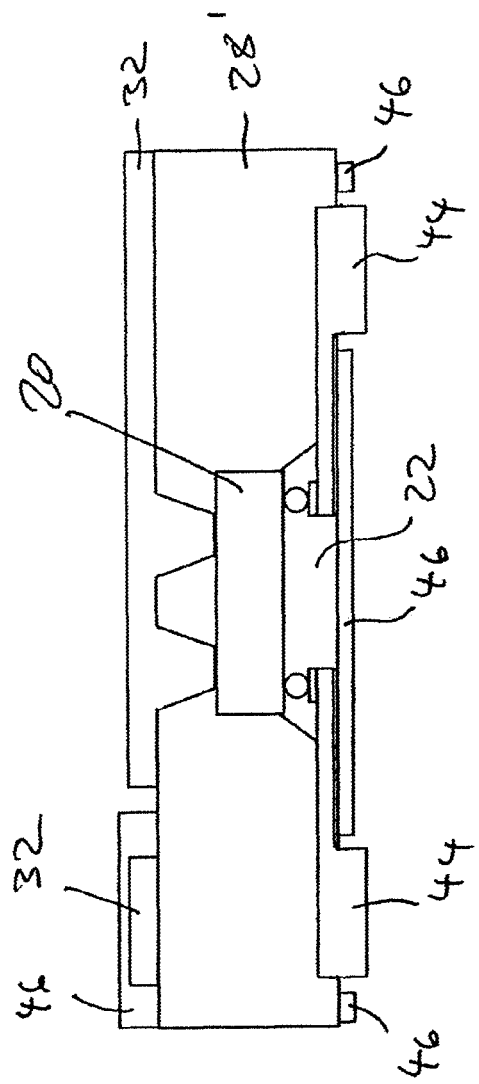
FIG. 14 shows an exemplary embodiment for a conductor structure element according to the invention with conductors protected by solder stop lacquer.

According to the invention, after the removal of the copper coating 14 the conductive pattern structures 16 are embedded in the resin layer 28', i.e. they do not project. This opens up the possibility of applying an additional copper layer 42 throughout or selectively on these "sunken" conductive pattern structures and of forming stepped conductors 44 at desired points (cf. FIGS. 12 and 13). The plating of the layer 42 is carried out before the removal and/or possible differential etching of the copper coating 14. Exposed conductors can be protected by solder stop lacquer 46 (cf. FIG. 14). Due to the at least partial removal of the copper coating 14 (and of the copper layer 42 optionally plated thereon), the conductive pattern structure 16 is "exposed," that is, the structure of the conductive pattern with the layer sequence 16-14-42 becomes visible again, in that the intervening copper-coated regions (copper coating 14 and optionally copper layer 42) are etched. Depending on which layer thickness of the conductor structures is required, the coating (14; 42) on the actual conductive pattern layer 16 can also be at least partially etched and/or further platings can also be carried out (for example, in the case of the stepped conductor 44 described).

Figure 15:
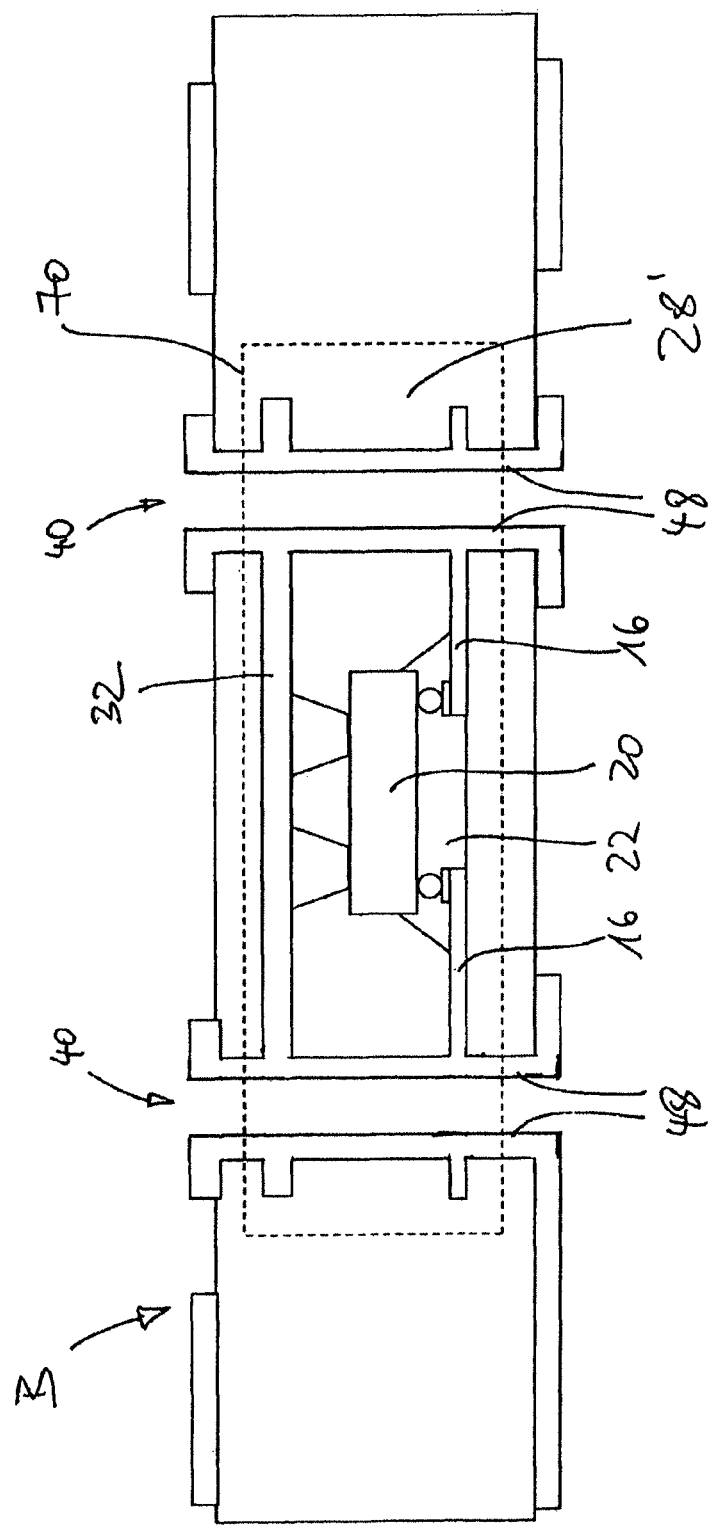
FIG. 15 shows a further exemplary embodiment of a conductor structure element according to the invention which is embedded as a "component housing" into a multilayer structure.

FIG. 15 shows a further field of application of the invention. Here, a component 70 (shown by a broken line) prefabricated according to the invention is laminated into a multilayer structure of a printed circuit board B. The electrical connection to the printed circuit board B is made by drilling through the conductive pattern structure 16 at the positions provided for this purpose and metallizing these boreholes using processes that are conventional in circuit board technology (copper layer 48). In order to ensure a reliable metallic connection of the through-platings 40 to the conductive pattern structure 16, it is advantageous to make them of pure copper. The layer sequence known from RU 2291598 C2 is not suitable for a process of this type.

Figure 16:
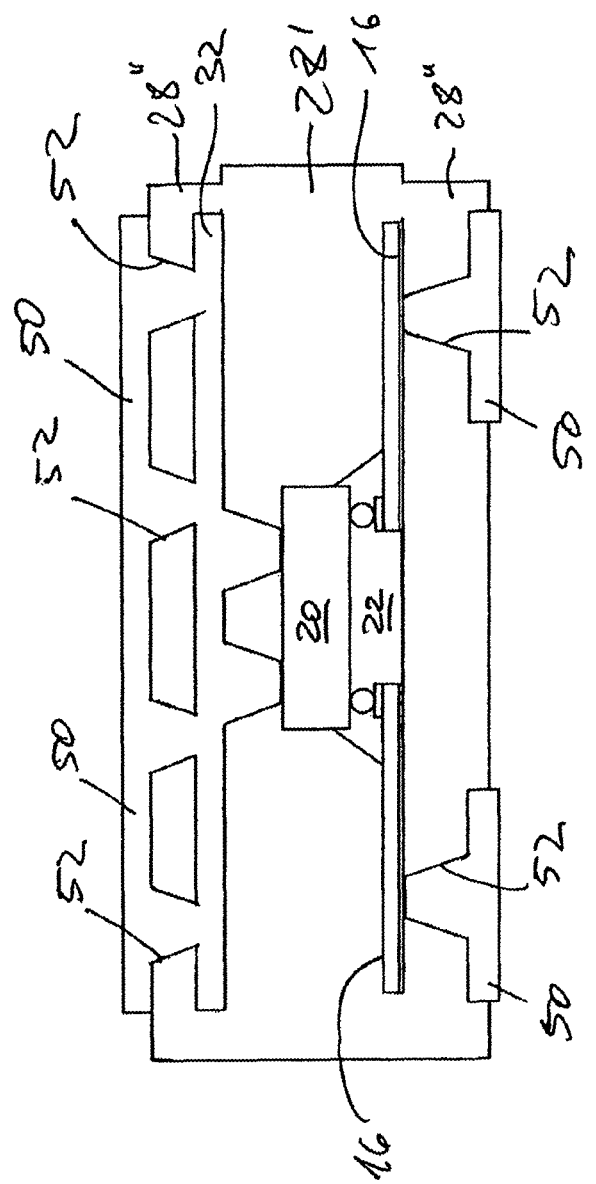
FIG. 16 shows a further exemplary embodiment of a conductor structure element according to the invention.

FIG. 16 shows a further exemplary embodiment in which additional layers (for example FR-4 or RCC layers 28'') are laminated and corresponding additional planes of conductor paths 50 with corresponding through-platings 42 can be formed. The reliability of the structures when exposed to alternating temperature stresses can be increased thereby.

Figure 17:
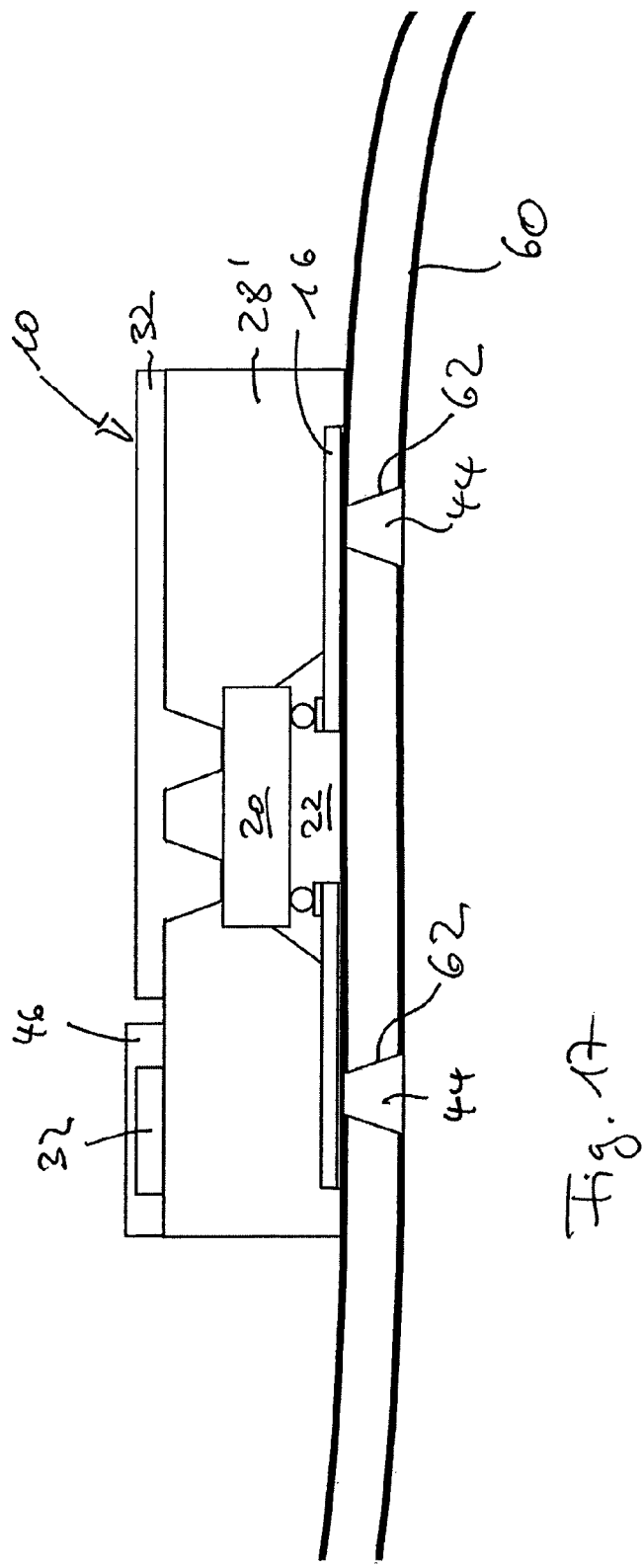
FIG. 17 shows a cross-sectional side view of an ultra-thin package according to the invention on a flex substrate.
Figure 13A:
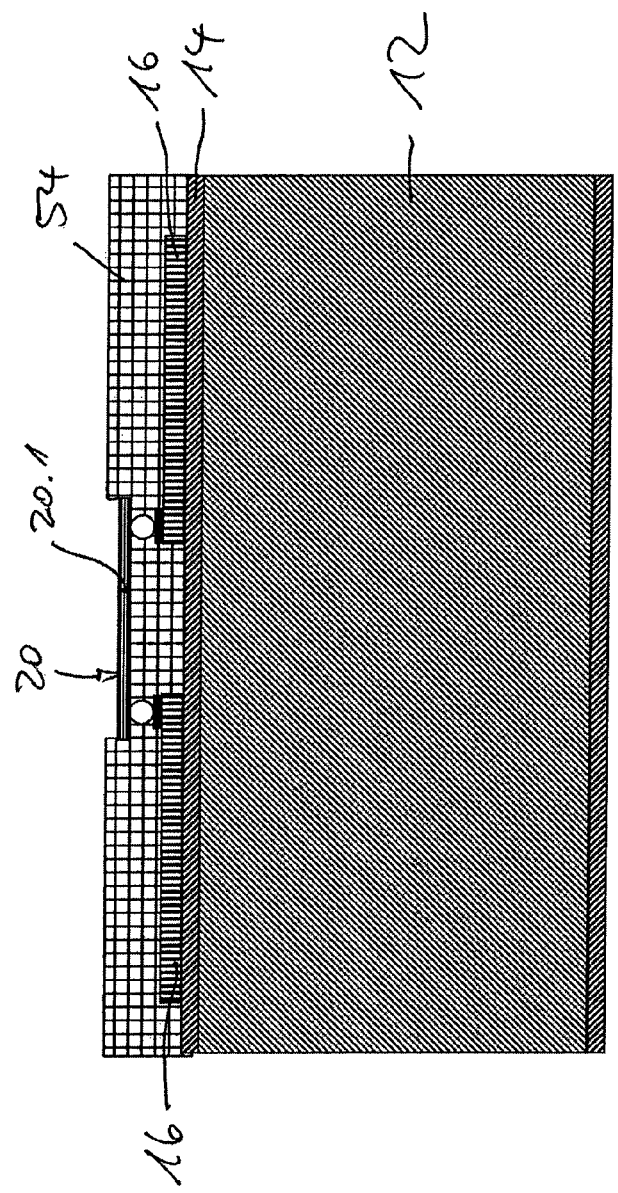

FIG. 17 shows an ultra-thin package 10 according to the invention on a so-called flexible flex substrate 60. The electrical contact between the flexible carrier PCB and the conductive pattern structure 16 of the thin component is in this case achieved via metallized holes 62 which are produced, e. g. by laser erosion and are copper plated by means of conventional metallization processes. To this end, the ultra-thin package 10 is adhesively laminated with the flex substrate 60, the holes 62 are produced and subsequently metallized. The electrical connection between the conductor structure element 10 and the flex substrate 60 is thus made via the metallization of the holes 62. These holes 62 (as shown in the figure) can be designed as blind holes extending to the conductor path 16. However, they can also be designed as through-holes (not shown). This results according to the invention in a thin electronic assembly that does not have to be soldered.

FIG. 18 shows a further exemplary embodiment of a multilayer structure according to the invention before the removal of the rigid carrier 12. Compared to the variant previously described, in the multilayer structure shown in FIG. 18 one layer is applied with etch resist 54. The etch resist layer 54 has a height that is selected such that it covers active layers 20.1 at the bottom of the chip 20 (as shown in the figure), around the sawn edges thereof, namely at the level of the layer transition region. By this is meant the location of the chip 20 at which active and inactive layers meet (shown as a dashed line in FIG. 18). The etch resist layer 54 is thus applied thickly enough that it laterally covers the chip at least up to the height of this point. However, it can also be applied more thickly and thus laterally cover the chip to a point higher than the layer transition region.

As an etch resist, materials can be used which are temporarily used for the etching process and thereafter are removed again, or materials are used which are etch-resistant and due to their material properties can remain in the structure.

In a next step, upper non-active layers 20.2 of the chip 20 projecting beyond the etch resist 54 and lying above the active layers 20.1 (as shown in FIG. 18) are removed. This can be carried out mechanically and/or chemically. Only the lower active layers 20.1 of the chip 20 remain, optionally a thin residue of the non-active layers 20.2, so that an ultra-thin chip remains which has only the essential and necessary layers (cf. FIG. 19). By means of the method according to the invention the assembly of ultra-thin chips can be considerably simplified, since they arch so much when thinned in the unassembled state, i.e. before assembly, that an assembly process is successful only with considerable effort. The presence of an etch resist layer 54 naturally suggests a chemical removal of the inactive chip layers 20.2. This is carried out by means of etching. Between the active layers 20.1 and the non-active (silicon) layers 20.2 of the chip 20 a layer 21 of etch-resistant material is provided (which in principle corresponds to the dashed line in FIG. 18 and in principle represents the layer transition region described above), whereby the etching process is facilitated, since it ends automatically when the etch-resistant layer 21 is reached. The chip 20 thus eroded down to its active layer 20.1 thus joins flush with the surface of the etch resist layer 54 or may even be located somewhat lower than it, if the etch resist layer 54, as explained above, has been applied higher than the active layers 20.1 of the chip 20 (cf. FIG. 18a). The etch resist layer 54—as shown in FIG. 18a as well as in FIGS. 19a and 20a—can alternatively be used to underfill the chip or it can be used in combination with a separately provided underfilling (reference number 22 in FIGS. 18, 19 and 20).

After the removal of the non-active layers 20.2 of the chip (FIG. 19), the structure produced, as can be seen from FIG. 20, can be covered with a prepreg layer 56 and compressed/laminated. Optionally a copper foil F applied thereon can be compressed with it. FIGS. 19a and 20a respectively show the embodiment with the chemically back-thinned chip 20 in a lower position compared to the level of the etch resist layer 54.

In a next step (cf. FIG. 21), the detachment of the rigid carrier 12 is carried out as well as differential etching of the copper coating 14, as well as optionally further processing (as also already described above in connection with FIGS. 11 through 17, i.e. for example, provision of contacting and/or through-platings, lamination in a multilayer structure, use as interposer, etc.)

The structure shown in FIG. 20 can alternatively also be inserted in a multilayer structure before the detachment of the rigid carrier or it can be compressed with a further multilayer structure according to the invention with a rigid carrier in a sandwich structure so that the two rigid carriers respectively come to rest on the outside (at the top and bottom in figure) and finally can be dissolved or detached in a common etching process. Before the detachment process, further measures for further processing can be carried out.

Alternatively, detachment of the rigid carrier 12 can first be carried out and then be followed by lamination into a printed circuit board. Since the eroded chip 20 is now flush with the surface of the etch resist 54, or optionally is situated even somewhat lower, the formation of cavities in prepregs of a multilayer can be omitted.

Due to the back-thinning according to the invention, the chip thickness or chip height can be restricted to the active layers 20.1 and is therefore very thin, at approx. 10 µm, depending on the chip design. A total thickness of the multilayer structure shown in FIG. 21 of approx. 100 µm can thus be achieved.

The detachment of the non-active silicon (layers 20.2) from the back of the chip 20 could also be facilitated by a modified production of the chip 20 itself: Before the production of the first active layers 20.1, an etch-resistant layer is deposited on a wafer. Epitaxial layers can subsequently be deposited on this etch-resistant layer, from which then successively the active layers 20.1 of the chip 20 are produced. The wafer is thereby used as a carrier for the active layers 20.1

After the assembly of a chip produced in this manner on the carrier according to the invention (and preparation as described in connection with FIG. 15), the carrier silicon could now be completely etched off with an etching medium.

The invention claimed is:

1. A method for producing a conductor structure element, comprising:
    providing a rigid carrier;
    electrodepositing a copper coating on the rigid carrier;
    applying a conductive pattern structure on the copper coating;
    populating the conductive pattern structure with components;
    laminating the carrier with at least one electrically insulating layer;
    removing the rigid carrier by dissolving or etching the rigid carrier; and
    at least partially removing the copper coating to expose the conductive pattern structure.

2. The method according to claim 1, wherein the step of providing the rigid carrier is implemented with an amphoteric metal.

3. The method according to claim 1, wherein the step of providing the rigid carrier is implemented with aluminum or an aluminum alloy.

4. The method according to claim 1, wherein the step of electrodepositing the copper coating is implemented to a thickness of between approximately 2 and approximately 7 µm.

5. The method according to claim 1, wherein the step of applying the conductive pattern structure is implemented with copper.

6. The method according to claim 1, the step of applying the conductive pattern structure is implemented with electrodeposition.

7. The method according to claim 1, and further comprising the step of depositing a further outer conductive pattern before the step of at least partially removing the copper coating.

8. The method according to claim 1, and further comprising the step of depositing an etch-resistant metal layer on the copper coating before the step of applying the conductive pattern structure.

9. The method according to claim 1, and further comprising the step of forming one or more contact coatings on connection points for the components on the conductive pattern structure.

10. The method according to claim 1, and further comprising the step of forming one or more assembly domes as component connection points on the conductive pattern structure.

11. The method according to claim 1, wherein the step of applying the conductive pattern structure comprises applying a first plating and applying a following plating at least on some regions on the first plating to achieve different copper layer thicknesses in a layer.

12. The method according to claim 1, and further comprising the step of separating or individualizing the rigid carrier into smaller format cards before the step of populating the rigid carrier with the components.

13. The method according to claim 12, and further comprising the step of returning the cards into a fitting frame for further processing.

14. The method according to claim 1, and further comprising the step of underfilling at least one of the components.

15. The method according to claim 1, wherein before the step of removing the rigid carrier, the following steps are provided:
    laying at least one adhesive layer on the rigid carrier; and
    compressing with a copper foil as a terminating layer for laminate formation or compressing with a PCB semi-finished product composed of a sequence of several conducting and insulating layers.

16. The method according to claim 1, and further comprising the step of back-thinning or ablating an assembled chip.

17. The method according to claim 16, in which the step of back-thinning comprises the steps of applying an etch-resistant layer for laterally covering edges of active chip layers and subsequent removing of projecting, non-active chip layers.

18. The method according to claim 16, wherein the step of back-thinning of the assembled chip is implemented mechanically by grinding or chemically.

19. The method according to claim 16, and further comprising the step of producing active layers of the chip on an etch-resistant layer to protect the active layers of the chip from etching attack during the step of back-thinning.

20. The method according to claim 1, wherein the step of providing the rigid carrier is implemented with a rigid carrier having a thickness between 500 and 1,000 µm.

* * * * *